United States Patent [19]
Bernard

[11] Patent Number: 6,002,858
[45] Date of Patent: Dec. 14, 1999

[54] CYCLE TIME OPTIMIZATION FOR SELF-TIMED READ ONLY MEMORY COMPILERS

[75] Inventor: Marie Bernard, Colemars, France

[73] Assignee: VLSI Technology, Inc., San Jose, Calif.

[21] Appl. No.: 08/936,728

[22] Filed: Sep. 25, 1997

[51] Int. Cl.$^6$ .............................. G06F 17/50; G11C 5/06
[52] U.S. Cl. ................................ 395/500.15; 365/185.2; 365/210
[58] Field of Search ...................... 395/500.02, 500.15, 395/500.17, 500.18; 365/210, 185.2

[56] References Cited

U.S. PATENT DOCUMENTS

| | | | |
|---|---|---|---|
| 4,541,077 | 9/1985 | Rapp | 365/210 |
| 5,377,153 | 12/1994 | Guritz et al. | 365/210 |

*Primary Examiner*—Kevin J. Teska
*Assistant Examiner*—Leigh Marie Garbowski
*Attorney, Agent, or Firm*—Burns, Doane, Swecker & Mathis, L.L.P

[57] ABSTRACT

The present invention, generally speaking, takes into account the programming of a particular ROM in order to calibrate and more nearly optimize the timing of the ROMs timing unit. In one embodiment of the invention, a dummy line is less than fully populated with transistors (loads) in accordance with the greatest degree to which a corresponding actual line is populated with transistors. The dummy line may be a word line or a bit line. Furthermore, both a dummy word line and a dummy bit line may be provided. In accordance with a further embodiment of the invention, if the complement of the number of transistors in the least populated line is less than the number of transistors in the most populated line, then the memory map of the ROM may be uniformly inverted, with the output of the ROM also being inverted. Line loading and cycle time are therefore decreased, allowing for higher speed ROM operation.

4 Claims, 5 Drawing Sheets

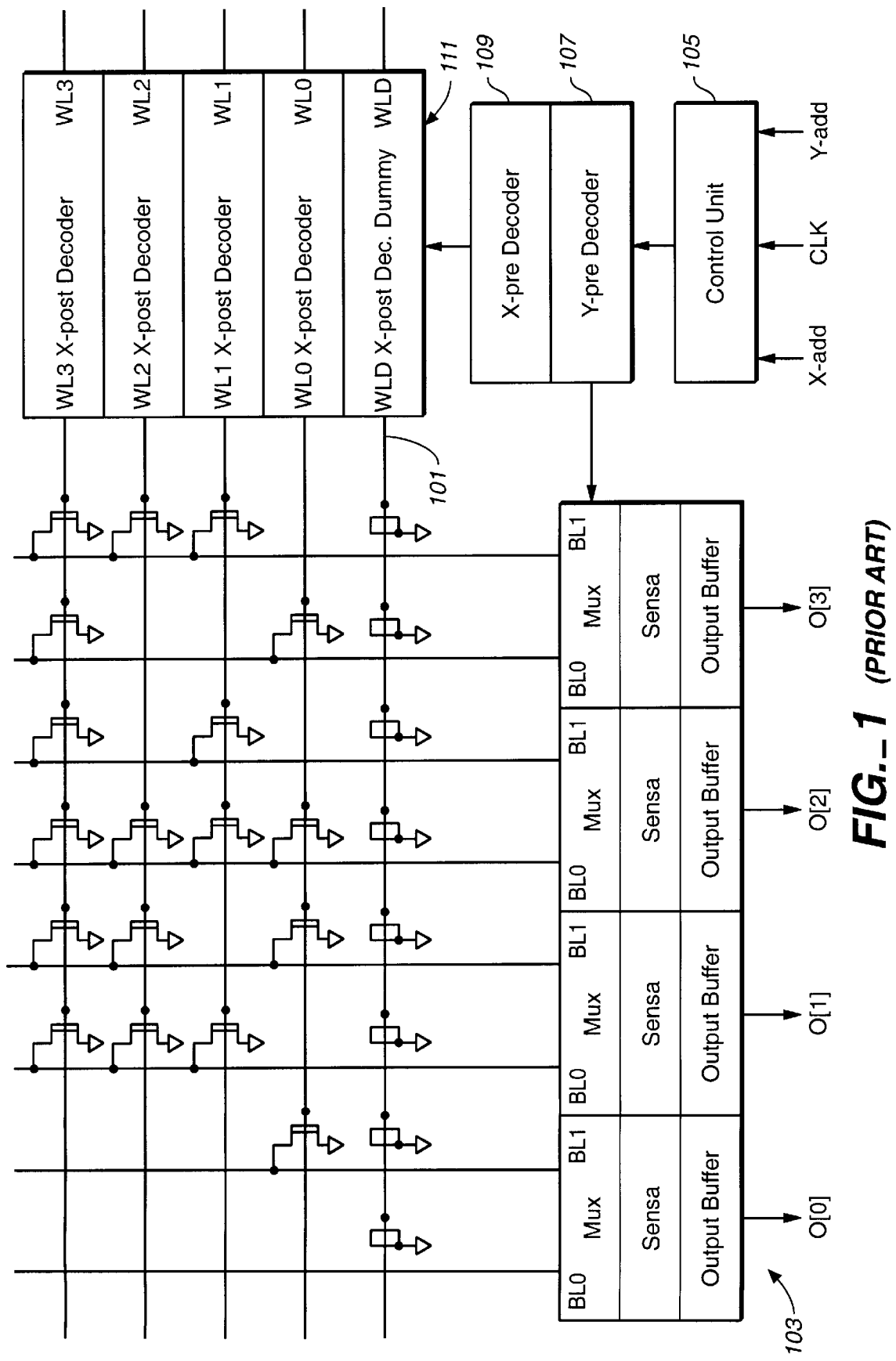
FIG._1 (PRIOR ART)

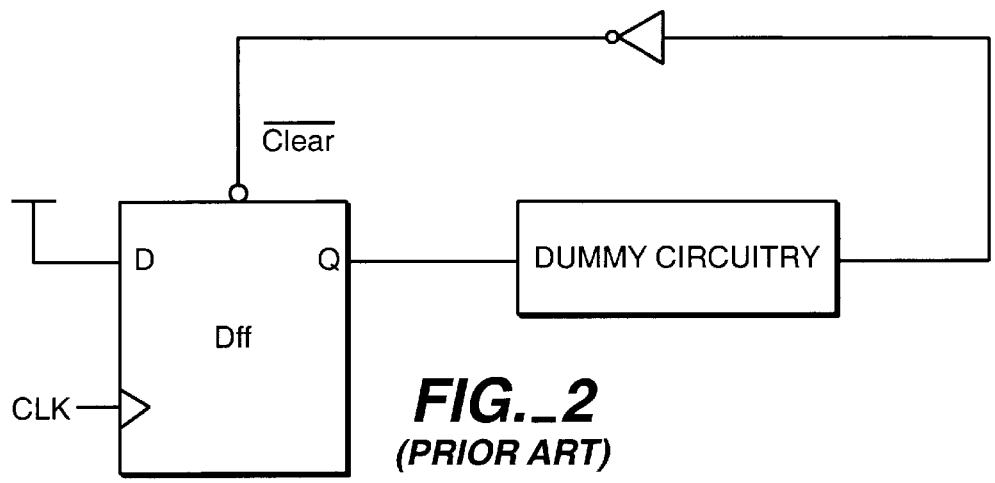
FIG._2
*(PRIOR ART)*
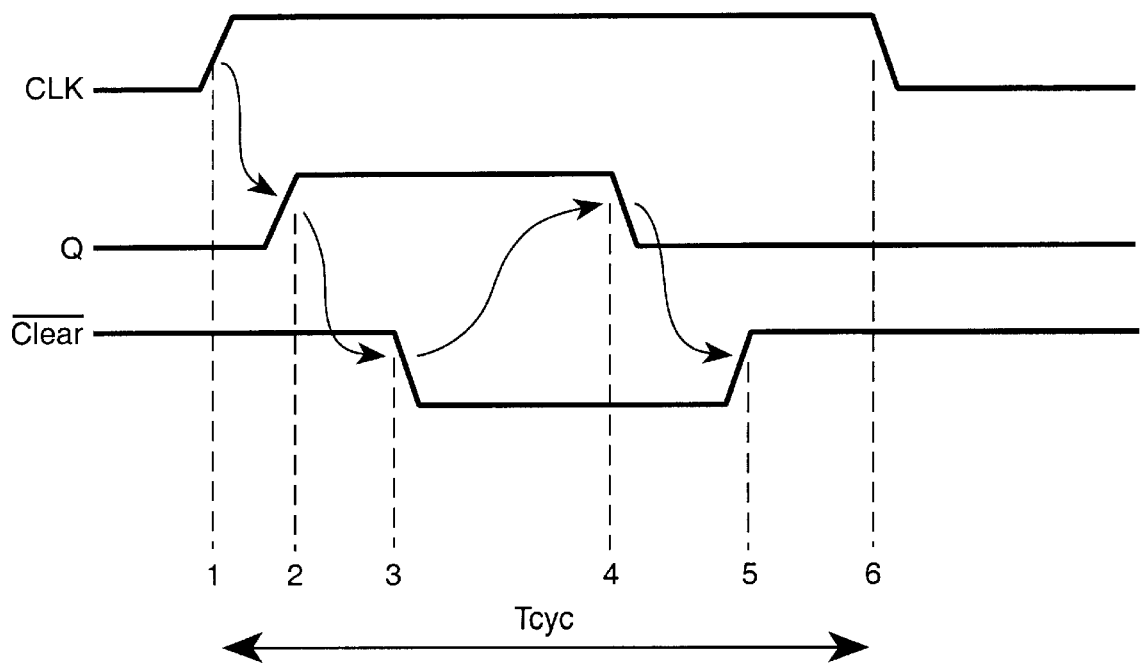
FIG._3
*(PRIOR ART)*

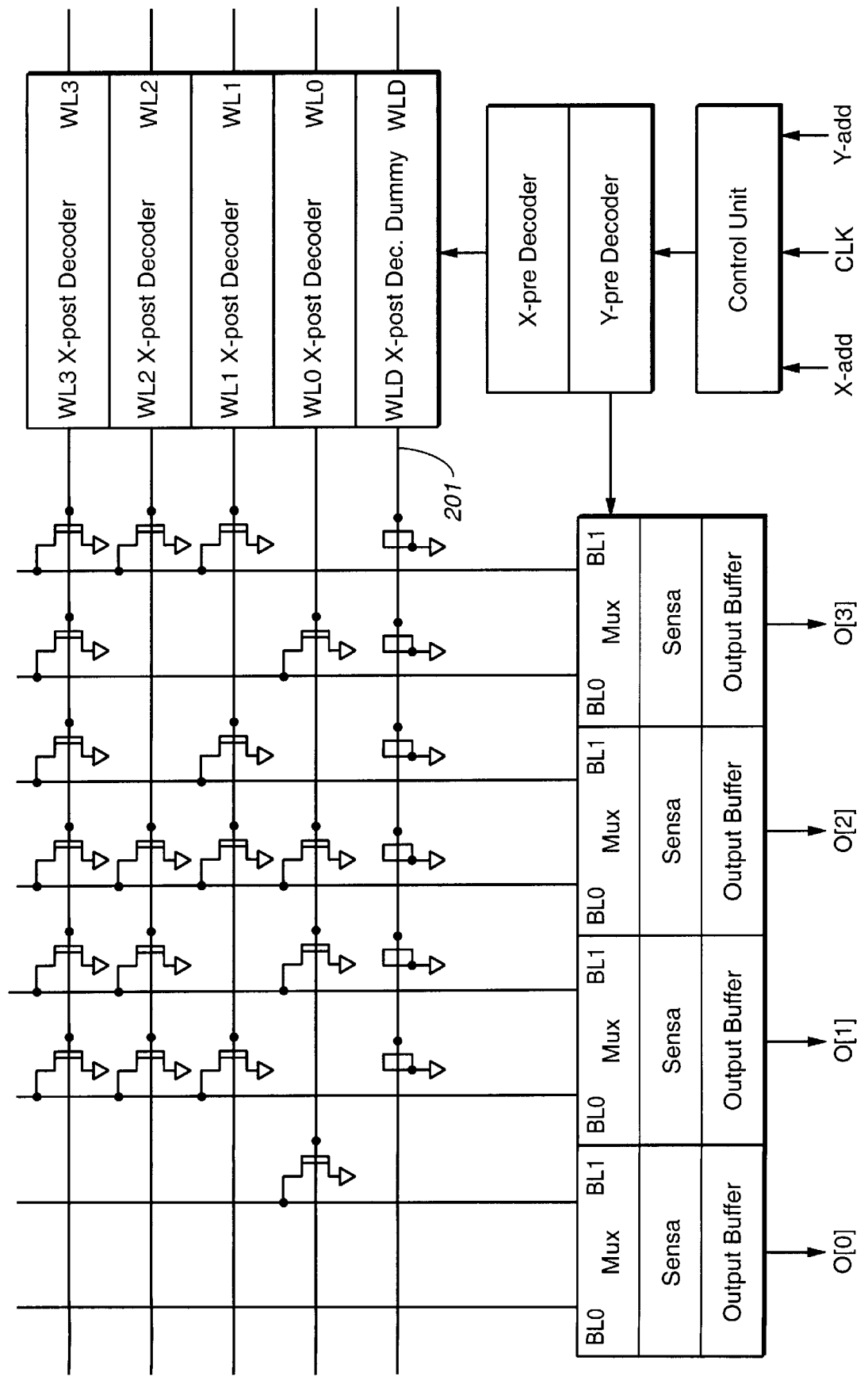
FIG._4

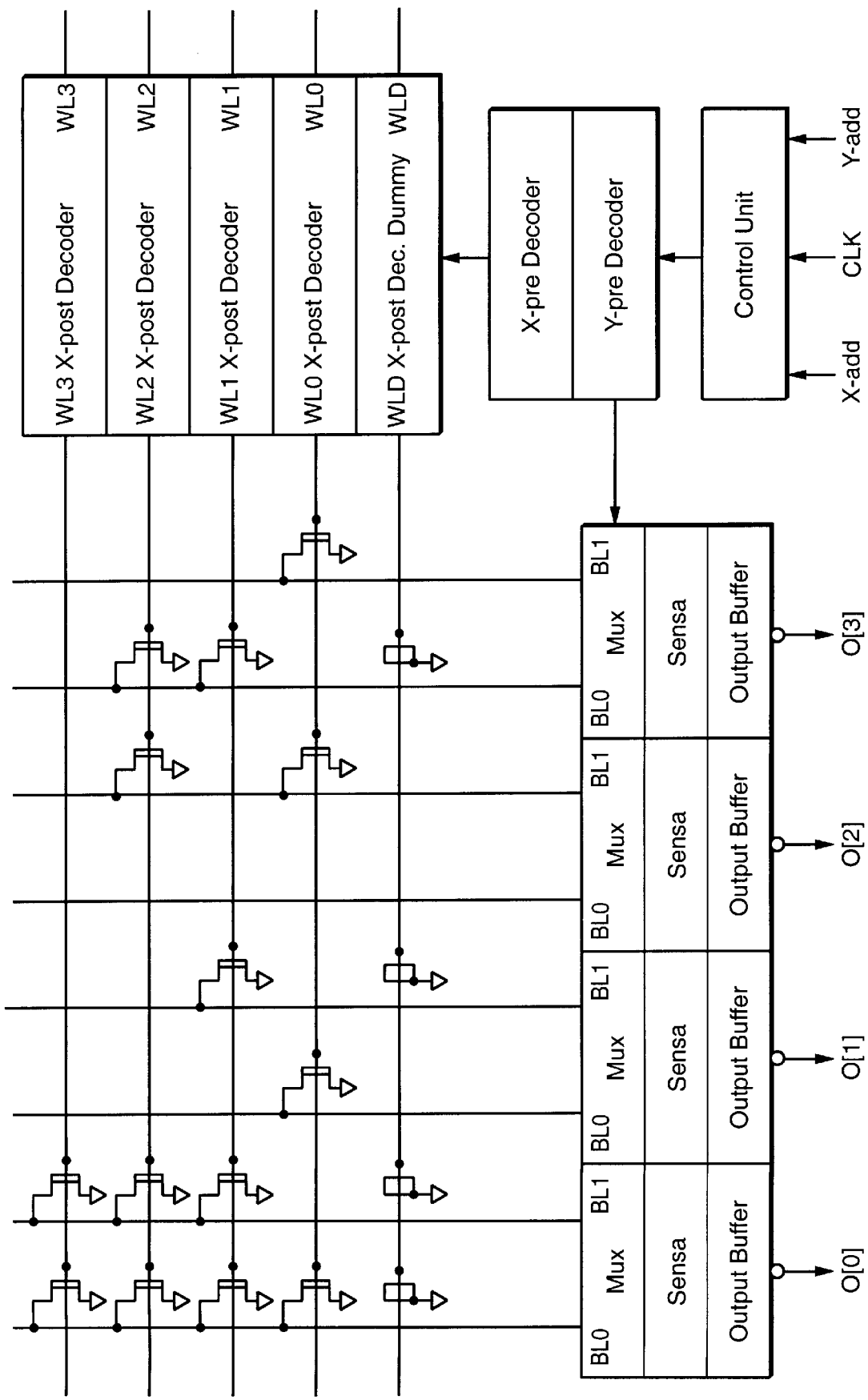
FIG._5

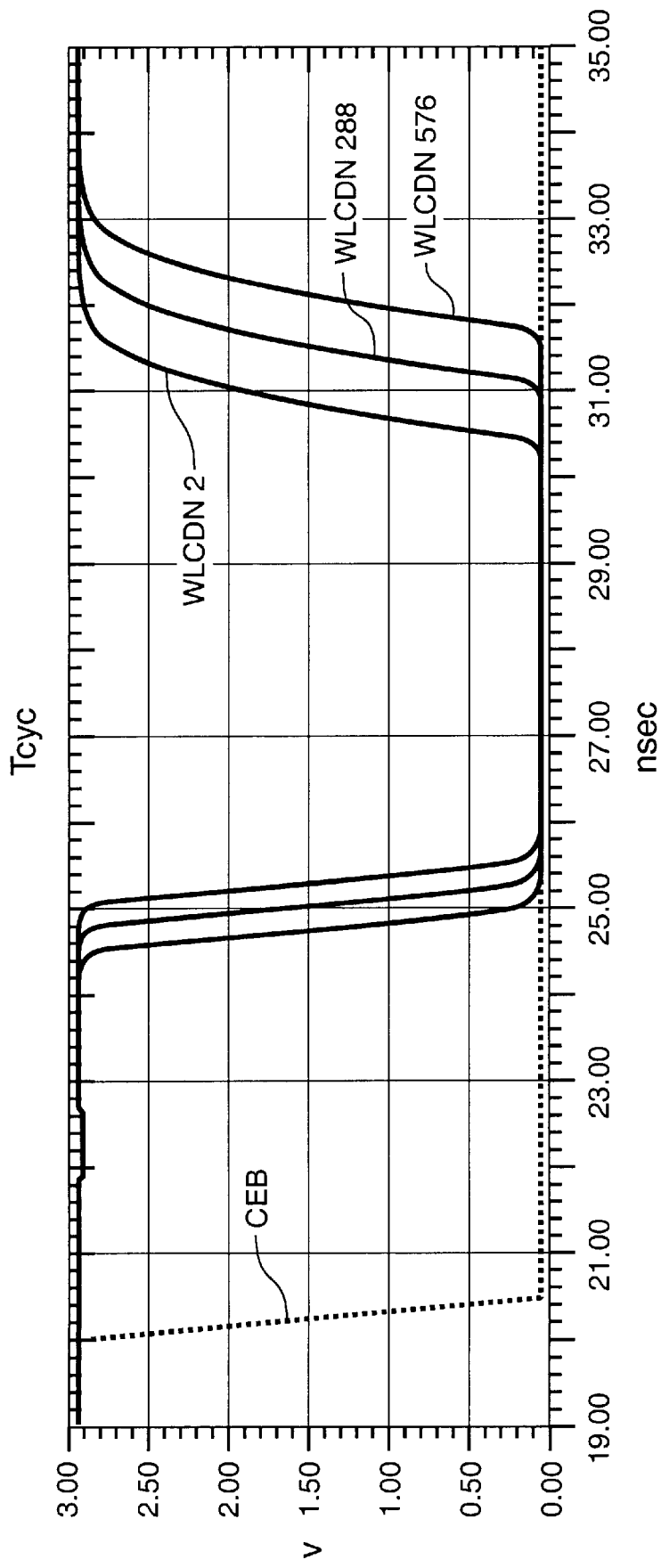
FIG._6

CYCLE TIME OPTIMIZATION FOR SELF-TIMED READ ONLY MEMORY COMPILERS

BACKGROUND OF THE INVENTION

1. Field of the Invention

The present invention relates to read only memories (ROMs) and to ROM compilers.

2. State of the Art

A ROM is typically realized as transistors arranged in accordance with a Word-Line/Bit-Line organization. A timing unit, based on a ROM clock signal, generates pulses that control sequencing of the read operation. For example, the timing unit generates pulses to disable/enable bit line precharge, word line selection to enable/disable the sense amplifier and, finally, to register the read value. The proper timing of the foregoing signals depends on various factors including the process technology employed, the size and organization of the ROM, etc. Calibration of the duration of these internal pulses is key to optimizing the read cycle time and the power consumption of the ROM.

It is desirable for the realization of the timing unit to remain the same despite variations in the foregoing particulars. To achieve this end, self-timed synchronous ROMs have been developed. A self-timed synchronous ROM is described, for example, in Silburt et al. A 200 MHz 0.8 um BiCMOS Modular Memory Family of DRAM and Multi-port SRAM, IEEE 1992 Custom Integrated Circuits Conference, incorporated herein by reference.

In a self-timed synchronous ROM, critical path timing is physically modeled within the ROM itself. In general, prior timing unit systems mimic the ROM critical path (the discharge bit line) using "dummy paths", namely a dummy word line and a dummy bit line. These dummy paths model the worst case path delay of a read operation for a given ROM configuration. The worst case occurs in the instance of a word line and a bit line having all the transistors programmed. In some ROMs, only a dummy word line is used. Delay due to the discharge of the bit line is modeled using a programmable delay dependant on the number of word lines.

Referring more particularly to FIG. 1, a four-bit by eight-word ROM is shown, with word lines running in the X direction and bit lines running in the Y direction. (The memory may be organized into right and left memory maps, in which case the word lines may extend also toward the right for a right memory map, not shown.) Each intersection of a word line and a bit line defines one bit of information. If a transistor is formed at an intersection, then that bit is programmed with a logic zero value, for example. If no transistor is formed, then that bit is programmed with a logic one value. A dummy word line 101 is provided having loads at each intersection, thereby modeling the delay of a word line having a transistor at each intersection. Bit lines are paired and input to respective output circuitry blocks 103, each block including a multiplexer, a sense amplifier and an output buffer. A control unit 105 receives a clock signal, an X address and a Y address. The Y address is applied to a Y predecoder 107 that controls the multiplexers to select either bit line zero or bit line one. The X address is applied to an X predecoder 109. Output signals from the X predecoder are applied to respective X post decoders 111 in response to which exactly one of the post decoders is enabled to activate a particular word line.

The arrangement and operation of a conventional self-timed memory control circuit may be better understood with reference to FIGS. 2 and 3. The control circuit may be realized using a D flip-flop (Dff), for example. The Dff has its input tied high and is clocked by a clock signal from the memories timing unit. The Q output signal is coupled through dummy circuity that loads the output and through an inverter back to a ($\overline{\text{Clear}}$) input of the Dff.

The following sequence of operations is performed:

1. In this case, a positive edge on the (Clk) Clock signal starts a read cycle operation.
2. This positive edge activates a positive pulse on the (Q) output signal of the Dff. This activates for example the sense amplifier, enabling the correct Word Line to be selected, opening the output latches, etc.
3. This pulse is then delayed using the dummy circuitry to reset itself ($\overline{\text{Clear}}$). At this stage the read has been done, but the read cycle time is not completed.
4. The reset mode is activated on the Dff, so the positive pulse on (Q) returns to low, disabling the sense amps and activating the bit line pre-charge for example. But at this stage the cycle time is not completed since a new positive edge on the clock could not start a new read cycle as the Dff still has its reset input activated.
5. The reset is deactivated so a new read operation can start. This is generally counted as the cycle time (Tcyc). It should be noted that the cycle time is not dependant on the clock duty cycle.

The foregoing worst case approach, although it simplifies ROM design, unnecessarily limits ROM performance.

SUMMARY OF THE INVENTION

The present invention, generally speaking, takes into account the programming of a particular ROM in order to calibrate and more nearly optimize the timing of the ROMs timing unit. In one embodiment of the invention, a dummy line is less than fully populated with transistors (loads) in accordance with the greatest degree to which a corresponding actual line is populated with transistors. The dummy line may be a word line or a bit line. Furthermore, both a dummy word line and a dummy bit line may be provided. In accordance with a further embodiment of the invention, if the complement of the number of transistors in the least populated line is less than the number of transistors in the most populated line, then the memory map of the ROM may be uniformly inverted, with the output of the ROM also being inverted. Line loading and cycle time are therefore decreased, allowing for higher speed ROM operation.

BRIEF DESCRIPTION OF THE DRAWING

The present invention may be further understood from the following description in conjunction with the appended drawing.

In the drawing:

FIG. 1 is a block diagram of a self-timed synchronous ROM;

FIG. 2 is a schematic diagram of a conventional self-timed memory control circuit;

FIG. 3 is a timing diagram of operation of the self-timed memory control circuit of FIG. 2.

FIG. 4 is a block diagram of a self-timed synchronous ROM in accordance with the first embodiment of the present invention;

FIG. 5 is a block diagram of a self-timed synchronous ROM in accordance with the second embodiment of the present invention;

FIG. 6 is a plot of simulation results comparing the cycle times of ROMs having different memory maps.

DETAILED DESCRIPTION OF THE PREFERRED EMBODIMENTS

Referring now to FIG. 2, an example is shown of the self-timed synchronous ROM in accordance with the first embodiment of the present invention. The ROM of FIG. 2 differs from that of FIG. 1 in that the dummy word line 201 does not presume the worst possible case. Instead, the dummy word line mimics the delay of the most populated word line of the programmed ROM. Hence, in FIG. 2, since the most populated word line is WL3, populated with 6 transistors, the dummy word line is also populated with 6 transistors so as to meet the delay of WL3. In the example of FIG. 2, no dummy bit line is provided. Instead the delay due to the discharge of the bit line is assumed to be modeled using a programmable delay as previously described. In other embodiments, both a dummy word line and a dummy bit line may be provided.

In FIG. 2, the condition holds that the complement of the number of transistors in the least populated line is less than the number of transistors in the most populated line. That is, if the memory map is inverted, the line(s) having the fewest number of transistors (in this instance WL0, WL1 and WL2, each having 4 transistors) will become the line having the most transistors (in this case 8–4, or 4). The latter number is less than 6, the number of transistors in WL3, presently the most populated line. Accordingly a speed improvement may be obtained by inverting the memory map.

Inverting the memory map of the ROM of FIG. 2 results in the ROM of FIG. 3. Note that whereas the maximum number of transistors in FIG. 2 is 6, in FIG. 3 the maximum number of transistors in a word line is 4.

As may be appreciated from the description thus far, the layout of a particular ROM (the loading of the dummy line or lines and the consequent timing) depends on the memory map of the ROM. From the standpoint of electronic design automation, this dependence requires changes in a ROM compiler used to layout ROMs. In particular, prior to laying out a dummy line, the memory map of the ROM is parsed to identify the line(s) having the greatest number of transistors and the line(s) having the least number of transistors. A decision is then made whether or not to invert the memory map. The dummy line is then loaded to model the delay of the line having the greatest number of transistors.

In order to appreciate the improvement of the present invention, the cycle times of three different ROMs were simulated. The results are tabulated in FIG. 4. Referring to FIG. 4, the cycle time of the ROM begins at the positive edge of a signal CEB and is completed when the WLCDN signal completes a positive pulse. A ROM size of 512 words by 72 outputs is assumed. Three different word line programmings of the same ROM were simulated in which the most number of transistors in a word line was the maximum (576), half the maximum (288) and a minimum number (2), respectively. The corresponding simulation traces are labeled WLCDN 576, WLCDN 288 and WLCDN 2, respectively. The simulated cycle times for the three different word line programmings are 12.5 ns, 11.8 ns and 11.1 ns, respectively. Hence, in this example, a speed improvement of up to 13% may be achieved using the teachings of the invention.

It will be apparent to those of ordinary skill in the art that the present invention may be embodied in other specific forms without departing from the spirit or essential character thereof. The disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A read only memory comprising:

a multiplicity of word lines and bit lines;

a multiplicity of switching devices coupled to said multiplicity of word lines and bit lines such that first terminals of a plurality of switching devices are coupled during operation to a same word line and second terminals of said plurality of switching devices are coupled during operation to respective different bit lines;

at least one of a dummy word line and a dummy bit line that is less than fully populated with switching devices in accordance with the greatest degree to which a corresponding actual line is populated with switching devices.

2. The apparatus of claim 1 further comprising means for inverting words read out from said read only memory.

3. Using an electronic designed tool, a method of designing a read only memory having:

a multiplicity of word lines and bit lines;

a multiplicity of switching devices coupled to said multiplicity of word lines and bit lines such that first terminals of a plurality of switching devices are coupled during operation to a same word line and second terminals of said plurality of switching devices are coupled during operation to respective different bit lines;

and having a given memory map, comprising the steps of:
 causing said memory map to determine from among one of word lines of said read only memory and bit lines of said read only memory a greatest number of transistors to which a line is coupled; and
 laying out a dummy line that is less than fully populated with switching devices in accordance with the greatest degree to which a corresponding actual line is populated with switching devices.

4. The method of claim 3, comprising the further steps of:

determining whether the complement of the number of transistors in the least populated line is less than the number of transistors in the most populated line; and if so, inverting said memory map and adding inverters to said read only memory to invert words output from said read only memory.

* * * * *